US009853172B2

(12) United States Patent
Gila et al.

(10) Patent No.: US 9,853,172 B2
(45) Date of Patent: Dec. 26, 2017

(54) LUMINESCENT SOLAR CONCENTRATOR

(71) Applicant: ENI S.P.A., Roma (IT)

(72) Inventors: Lilliana Gila, Cameriano (IT); Roberto Fusco, Novara (IT); Emilio Lucchelli, Milan (IT)

(73) Assignee: Eni S.p.A., Rome (IT)

( * ) Notice: Subject to any disclaimer, the term of this patent is extended or adjusted under 35 U.S.C. 154(b) by 130 days.

(21) Appl. No.: 14/650,661

(22) PCT Filed: Dec. 27, 2013

(86) PCT No.: PCT/IB2013/061367
§ 371 (c)(1),
(2) Date: Jun. 9, 2015

(87) PCT Pub. No.: WO2014/102742
PCT Pub. Date: Jul. 3, 2014

(65) Prior Publication Data
US 2016/0197205 A1    Jul. 7, 2016

(30) Foreign Application Priority Data

Dec. 28, 2012  (IT) .......................... MI2012A002250

(51) Int. Cl.
*H01L 31/052*    (2014.01)
*H01L 31/0232*   (2014.01)
*C09K 11/02*     (2006.01)
*H01L 31/055*    (2014.01)

(52) U.S. Cl.
CPC ........ *H01L 31/02327* (2013.01); *C09K 11/02* (2013.01); *C09K 11/025* (2013.01); *H01L 31/055* (2013.01); *C09K 2211/1011* (2013.01); *C09K 2211/1051* (2013.01); *C09K 2211/1416* (2013.01); *C09K 2211/1483* (2013.01); *Y02E 10/52* (2013.01)

(58) Field of Classification Search
CPC . H01L 31/02327; H01L 31/055; C09K 11/02; C09K 11/025; C09K 11/06; C09K 2211/1011; C09K 2211/1051; C09K 2211/1483; C09K 2211/1416
See application file for complete search history.

(56) References Cited

U.S. PATENT DOCUMENTS

| 4,188,239 A * | 2/1980 | Boling ................. H01L 31/055 136/247 |
| 2009/0220652 A1* | 9/2009 | Gardner ............... A23B 4/0235 426/92 |
| 2012/0138124 A1* | 6/2012 | Shmueli ............... H01L 31/055 136/247 |
| 2012/0285528 A1 | 11/2012 | Takanohashi et al. | |

FOREIGN PATENT DOCUMENTS

| WO | WO2012052947 | 4/2001 |
| WO | WO2011048458 | 4/2011 |
| WO | WO2011048458 A1 | 4/2011 |
| WO | WO2012007834 | 1/2012 |
| WO | WO2012007834 A1 | 1/2012 |
| WO | WO2012052947 A1 | 4/2012 |

OTHER PUBLICATIONS

Oliveira et al, "Solvatochromic fluorescent propbes in bicontinous microemulsions", Journal of Molecular Structure 563-564, 2001, pp. 443-447.*
Sholin, et al., "Semiconducting Polymers and Quantum Dots in Luminescent Solar Concentrators for Solar Energy", in Journal of Applied Physics (2007), vol. 101, pp. 123114-1-123114-9.
Kennedy, et al., "Proceedings of the 23rd European Photovoltaic Solar Energy Conference and Exhibition", pp. 390-393, Sep. 1-5, 2008, Valencia Spain.
Lang, et al., "Ultrasonic Absorption Study of Microemulsions in Ternary and Pseudoternary Systems", in Journal of Physical Chemistry (1980), vol. 84 (12), pp. 1541-1547.
Oliveira, et al., "Solvatochromic Fluorescent Probes in Bicontinuous Microemulsions", in Journal of Molecular Structure (2001), vol. 563-564, pp. 443-447.
Ramos, et al., "Fluorescence in Microemulsions and Reversed Micelles", in "Analytica Chimica Acta" (1988), vol. 208, pp. 1-19.
Shao, et al., "Phase Structures of Microemulsions Determined by the Steady-State Fluorescence Method", in "Chinese Chemical Letters" (2001), vol. 12 (12), pp. 1109-1112.
International Search Report dated Mar. 28, 2014 for PCT/IB2013/061367.

* cited by examiner

*Primary Examiner* — Carol M Koslow
(74) *Attorney, Agent, or Firm* — Abel Law Group, LLP

(57) ABSTRACT

Luminescent solar concentrator (LSC) comprising an aqueous microemulsion including at least one photoluminescent compound. Said luminescent solar concentrator (LSC) can be advantageously used in solar devices (i.e. devices for exploiting solar energy) such as, for example, photovoltaic cells (or solar cells), photoelectrolytic cells. Said luminescent solar concentrator (LSC) can also be advantageously used in photovoltaic windows.

14 Claims, 2 Drawing Sheets

LUMINESCENT SOLAR CONCENTRATOR

The present invention relates to a luminescent solar concentrator.

More specifically, the present invention relates to a luminescent solar concentrator (LSC) comprising an aqueous microemulsion including at least one photoluminescent compound.

Said luminescent solar concentrator (LSC) can be advantageously used in solar devices (i.e. devices for exploiting solar energy) such as, for example, photovoltaic cells (or solar cells), photoelectrolytic cells. Said luminescent solar concentrator (LSC) can also be advantageously used in photovoltaic windows.

In the state of the art, one of the main limits in exploiting the energy of solar radiations is represented by the capacity of solar devices of optimally absorbing only radiations having wavelengths within a narrow spectral range.

For example, against a spectral range of solar radiation extending from wavelengths of about 300 nm to wavelengths of about 2500 nm, photovoltaic cells (or solar cells) based on crystalline silicon, for example, have an optimum absorption area (effective spectrum) within the range of 900-1100 nm, whereas polymer photovoltaic cells (or solar cells) can be damaged when exposed to radiations with wavelengths lower than about 500 nm, due to induced photodegradation phenomena which become significant below this limit. The efficiency of the solar devices of the state of the art is typically at its maximum within the spectrum region ranging from 570 nm to 680 nm (yellow-orange).

The drawbacks previously indicated imply a limited external quantum efficiency (EQE) of the solar device, defined as the ratio between the number of electron-hole pairs generated in the semiconductor material of the solar device and the number of photons inciding on the solar device.

In order to improve the external quantum efficiency (EQE) of solar devices, devices have been developed, i.e. luminescent solar concentrators (LSCs) which, when interposed between the light radiation source (the sun) and the solar device, selectively absorb inciding radiations having wavelengths outside the effective spectrum of the solar device, re-emitting the energy absorbed in the form of photons having a wavelength within the effective spectrum. When the energy of the photons re-emitted by a luminescent solar concentrator (LSC) is higher than that of the inciding photons, the photoluminescent process, comprising the absorption of the solar radiation and the subsequent re-emission of photons having a lower wavelength, is also called "up-conversion" process. When, on the contrary, the energy of the photons emitted by a luminescent solar concentrator (LSC) is lower than that of the inciding photons, the photoluminescent process is called "down-shifting" process.

The luminescent solar concentrators (LSCs) known in the state of the art are typically in the solid state and comprise a support made of a material transparent, as such, to the radiations of interest (for example, transparent glass or transparent polymeric materials), comprising photoluminescent compounds consisting of organic compounds or of metal complexes. In particular, the support is transparent to radiations having a frequency within the effective spectrum of the solar device.

Said photoluminescent compounds can be deposited on the glass support as a thin film or, as in the case of polymeric materials, they can be dispersed inside the polymeric matrix. Alternatively, the polymeric matrix can be directly functionalized with photoluminescent chromophore groups.

Ideally, in order to be used in luminescent solar concentrators (LSCs), the photoluminescent compounds must have the following characteristics:

high luminescence quantum efficiency ($\phi$) [($\phi$) is defined according to the following equation (1) as the ratio between the number of photons emitted and the number of photons absorbed by a luminescent molecule, per unit of time, and has a maximum value equal to 1]:

$$(\phi) = \text{number of photons emitted/number of photons absorbed} \quad (1);$$

wide absorption band;

high molar extinction coefficient ($\epsilon$);

emission band in the spectral region wherein the solar device is most efficient;

absorption and emission bands well separated, that can be obtained, for example, thanks to a high Stokes shift defined as the difference, normally measured in frequency units ($cm^{-1}$), between the spectral positions of the maximum values of the absorption band and of the emission band, to prevent or minimize self-absorption phenomena.

Luminescent solar concentrators (LSCs) with photoluminescent compounds in the liquid state are also known. Said luminescent solar concentrators (LSCs) with photoluminescent compounds in the liquid state typically consist of a container with walls defining a volume, the walls being formed of transparent material. The transparent material of the walls is transparent to the radiations of interest (for example, transparent glass or transparent polymeric materials). A solution is filled into the cell volume, the solution generally being a solution in an organic solvent such as, for example, toluene, methanol, ethanol, chloroform, dichlorobenzene, comprising photoluminescent compounds consisting of organic compounds or metal complexes. In particular, the walls are transparent to radiations having a frequency within the effective spectrum of the solar device.

Luminescent solar concentrators (LSCs) containing material in the liquid state are described, for example, in the article of Sholin Y. et al., published in "*Journal of Applied Physics*" (2007), Vol. 101, pages 123114-1-123114-9. In said article, the performances are compared, in particular, of luminescent solar concentrators (LSCs) comprising semiconductor polymers (e.g., MDMO-PPV, MEH-DOOPPV, red polyfluorene), or "quantum dots" (e.g., CdSe/ZnS, CdHgTe), with those of luminescent solar concentrators (LSCs) comprising a photoluminescent dye, i.e. Rhodamine B, selected as reference. For this aim, the above semiconductor polymers are dissolved in chlorobenzene, the above "quantum dots" are dispersed in toluene, whereas Rhodamine B is dissolved in a mixture consisting of propylene carbonate and ethylene glycol. The optical efficiency of said solutions is measured using "liquid devices" constructed by "bending" a glass rod so as to form a rectangular frame and gluing it between two microscope slides obtaining a "glass box" having dimensions of 2.5 cm×7.5 cm×0.5 cm and introducing the solution of the compound to be analyzed into said "glass box" through a small opening which is then sealed. The data obtained show that semiconductor polymers (e.g., MDMO-PPV, MEH-DOOPPV, red polyfluorene) have reduced superimpositions between emission and absorption bands and consequently a reduced self-absorption; furthermore, their absorption can be controlled and their lifetimes in the excited states are longer. With respect to "quantum dots", on the other hand, it is believed that those commercially available cannot be conveniently used as photoluminescent compounds for luminescent solar concentrators (LSCs) as they have a high self-absorption and their quantum yield is low. In said article, it is therefore asserted that the above semiconductor polymers can be advantageously used in luminescent solar concentrators (LSCs).

Luminescent solar concentrators (LSCs) containing material in the liquid state are also described in the article of Kennedy M. et al., published in "*Proceedings of the 23rd European Photovoltaic Solar Energy Conference and Exhibition*", pages 390-393, 1-5 Sep. 2008, Valencia, Spain. In said article, luminescent solar concentrators (LSCs) are studied, comprising various dyes at suitable concentrations so as to increase the absorption of the solar spectrum with respect to luminescent solar concentrators (LSCs) comprising a single dye. The use of various dyes, however, has disadvantages such as, for example, loss in efficiency due to self-absorption effects. In order to optimize the type and the quantity of the dyes to be used in the construction of luminescent solar concentrators (LSCs) comprising more than one dye, a Montecarlo model suitably modified, was therefore used. The predictions of this model were then verified experimentally using luminescent solar concentrators (LSCs) containing material in the liquid state as these, unlike those in the solid state, generally consisting of a transparent polymer "doped" with photoluminescent dyes, allow measurements to be made more simply and accurately. For said aim, solutions in chloroform of dyes based on perylene and of BASF dyes (e.g., Lumogen® Yellow 170, Orange 240, Red 305), at different concentrations, were examined. The solutions thus prepared were introduced into a luminescent solar concentrator (LSC) consisting of a quartz cuvette having dimensions of 10 cm×4 cm×0.5 cm and of a silicon photovoltaic cell having dimensions of 2 cm×0.3 cm positioned on a side of the cuvette.

From what is specified above, can be deduced that the luminescent solar concentrators (LSCs) containing material in the liquid state known in literature, have small dimensions with a relatively reduced volume of solvent used, suitable for laboratory measurements. The preparation of luminescent solar concentrators (LSCs) containing material in the liquid state on a large scale, suitable, for example, for solar devices or for photovoltaic windows, therefore implies the use not only of large volumes of toxic and/or flammable solvents such as, for example, toluene, dichlorobenzene, chloroform, methanol, but also of high quantities of photoluminescent compounds, in order to obtain high concentrations of the same, so as to improve the performances of the solar devices or of the photovoltaic windows comprising said luminescent solar concentrators (LSCs).

The Applicant has therefore considered the problem of finding luminescent solar concentrators (LSCs) including a material in the liquid state, capable of overcoming the above drawbacks.

The Applicant has now found that luminescent solar concentrators (LSCs) including a material in the liquid state can be obtained using aqueous microemulsions comprising at least one photoluminescent compound. The use of said aqueous microemulsions allows the use of toxic and/or flammable solvents to be limited. Furthermore, the use of said aqueous microemulsions allows high concentrations of local photoluminescent compounds (i.e. high concentrations of photoluminescent compounds inside the micelles of the microemulsions) to be reached, without having to adopt high quantities of photoluminescent compounds. Said aqueous microemulsions, moreover, can be easily substituted at their life-end without having to substitute the whole solar device or the photovoltaic window, with consequent lower maintenance costs. The luminescent solar concentrators (LSCs) thus obtained are capable of improving the performances of solar devices such as, for example, photovoltaic cells (or solar cells) and photoelectrolytic cells. Furthermore, said luminescent solar concentrators (LSCs) can be advantageously used in photovoltaic windows.

An object of the present invention therefore relates to a luminescent solar concentrator (LSC) comprising an aqueous microemulsion including at least one photoluminescent compound.

For the aim of the present description and of the following claims, the definitions of the numerical ranges always comprise the extremes unless otherwise specified.

For the aim of the present description and of the following claims, the term "comprising" also includes the terms "which essentially consists of" or "which consists of".

For the aim of the present description and of the following claims, the term "microemulsion" refers to an emulsion in which the dispersed phase is distributed in the dispersing phase in the form of micelles having a diameter ranging from 1 nm to 100 nm, preferably ranging from 2 nm to 10 nm.

According to a preferred embodiment of the present invention, said aqueous microemulsion can comprise:
  from 20% by weight to 90% by weight, preferably from 50% by weight to 70% by weight, of water, with respect to the total weight of surfactant+co-surfactant+water;
  from 3% by weight to 25% by weight, preferably from 10% by weight to 15% by weight, of at least one surfactant, with respect to the total weight of surfactant+co-surfactant+water;
  from 6% by weight to 50% by weight, preferably from 20% by weight to 30% by weight, of at least one co-surfactant, with respect to the total weight of surfactant+co-surfactant+water;
  from 1% by weight to 90% by weight, preferably from 5% by weight to 20% by weight, of at least one organic solvent immiscible with water, with respect to the total weight of organic solvent immiscible with water+water;
  from 0.02% by weight to 2% by weight, preferably from 0.1% by weight to 0.5% by weight, of at least one photoluminescent compound, with respect to the total weight of photoluminescent compound+organic solvent immiscible with water.

Photoluminescent compounds which can be used for the aim of the present invention can be selected from photoluminescent compounds which absorb in the infrared and which are soluble and stable in the organic solvents immiscible with water indicated hereunder. Photoluminescent compounds which can be advantageously used for the aim of the present invention are, for example, compounds known with the commercial name Lumogen® of BASF, acene compounds described in international patent application WO 2011/048458 in the name of the Applicant, benzothiadiazole compounds.

According to a preferred embodiment of the present invention, said photoluminescent compound can be selected, for example, from benzothiadiazole compounds, acene compounds, or mixtures thereof. Preferably, said photoluminescent compound can be selected from 4,7-di-2-thienyl-2,1,3-benzothiadiazole (DTB), 9,10-diphenylanthracene (DPA), or mixtures thereof.

According to a preferred embodiment of the present invention, said surfactant can be selected from anionic surfactants such as, for example, sodium dodecyl sulfate (SDS), sodium octadecyl sulfate, nonylphenol ether sulfate, or mixtures thereof. Sodium dodecyl sulfate (SDS) is preferred.

According to a preferred embodiment of the present invention, said co-surfactant can be selected, for example, from alcohols such as, for example, 1-butanol, 1-pentanol, 1-hexanol, 1-octanol, or mixtures thereof. 1-Butanol is preferred.

According to a preferred embodiment of the present invention, said organic solvent immiscible with water can be selected from organic solvents immiscible with water such as, for example, toluene, cyclohexane, heptane, or mixtures thereof. Toluene is preferred.

The above microemulsions can be prepared according to methods known in the art as described, for example, by: Lang J. et al., in "*Journal of Physical Chemistry*" (1980), Vol. 84 (12), pages 1541-1547; Ramos G. R. et al., in "*Analytica Chimica Acta*" (1988), Vol. 208, pages 1-19; Shao G. Q. et al., in "*Chinese Chemical Letters*" (2001), Vol. 12 (12), pages 1109-1112; Oliveira M. E. C. D. R. et al., in "*Journal of Molecular Structure*" (2001), Vol. 563-564, pages 443-447.

According to a preferred embodiment of the present invention, said luminescent solar concentrator (LSC) comprises:
  a cell including walls defining a volume, the walls being formed of transparent material, the walls being located at four sides of the cell, at least one hole, preferably two holes, being provided in at least one of the walls, preferably in a wall of the same side;
  at least one aqueous microemulsion, including at least one photoluminescent compound, contained in the volume of the cell.

The transparent wall material which can be used for the aim of the present invention must be selected from transparent materials which must not be soluble in the aqueous microemulsion contained in said cell, which must not interact with said aqueous microemulsion, and which must be stable at the temperature of use of the luminescent solar concentrator and, more generally, under the environmental conditions in which it is used.

According to a preferred embodiment of the present invention, said transparent wall material can be selected, for example, from: transparent glass such as, for example, silica, quartz, alumina, titania, or mixtures thereof. Silica, quartz are preferred.

Said aqueous microemulsion is defined above.

Said luminescent solar concentrators (LSCs) can be prepared by means of processes known in the art as described, for example, in the article of Kennedy M. et al. indicated above, published in "*Proceedings of the 23rd European Photovoltaic Solar Energy Conference and Exhibition*", pages 390-393, 1-5 Sep. 2008, Valencia.

A further object of the present invention relates to a solar device comprising a luminescent solar concentrator (LSC) comprising an aqueous microemulsion including at least one photoluminescent compound.

According to a further aspect, the present invention relates to a solar device comprising at least one photovoltaic cell (or solar cell) or at least one photoelectrolytic cell positioned on the edges of a luminescent solar concentrator (LSC) comprising:
  a cell including walls defining a volume, the walls being formed of transparent material, the walls being located at four sides of the cell, at least one hole, preferably two holes, being provided in at least one of the walls, preferably in a wall of the same side;
  at least one aqueous microemulsion, including at least one photoluminescent compound, contained in the volume of the cell.

According to a further aspect, the present invention relates to a solar device comprising at least one photovoltaic cell (or solar cell) or at least one photoelectrolytic cell positioned on the edges of a luminescent solar concentrator (LSC) comprising:
  a cell including transparent walls defining a volume, said cell having four sides and provided with at least one hole, preferably two holes, on at least one of the four sides, preferably on the same side;
  at least one aqueous microemulsion, including at least one photoluminescent compound contained inside said cell.

Said transparent wall material and said aqueous microemulsion are defined above.

BRIEF DESCRIPTION OF THE DRAWINGS

The present invention will now be illustrated in greater detail by means of an embodiment with reference to FIGS. 1-3 provided hereunder.

Figure 1:
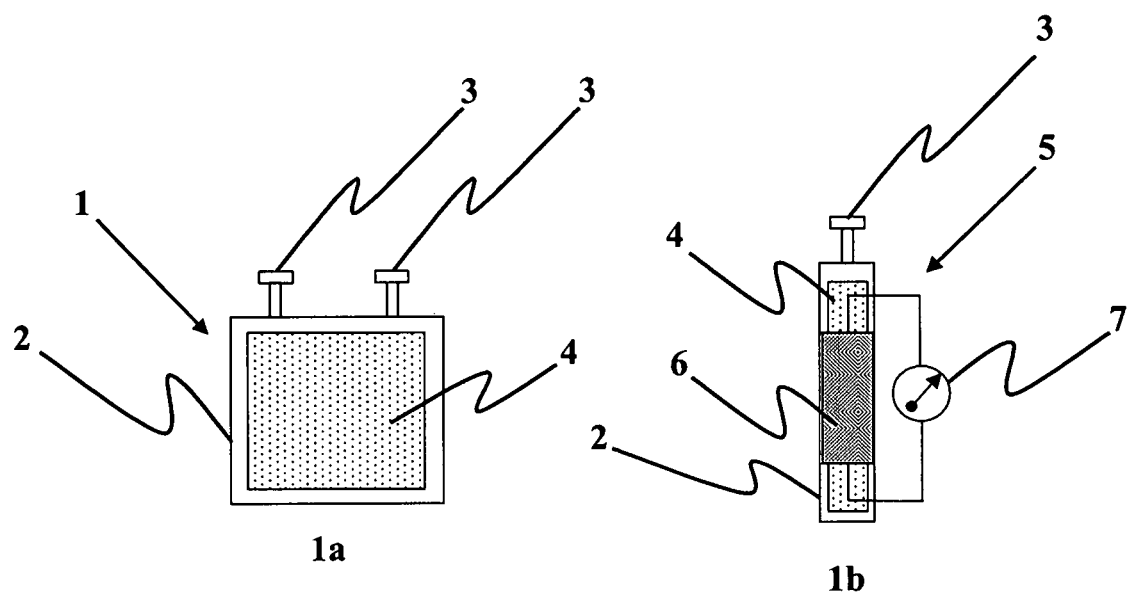
FIG. 1 represents a front view (1a) of a luminescent solar concentrator (LSC) (1) object of the present invention and a side view (1b) of a solar device (2) object of the present invention.

With reference to the front view (1a) represented in FIG. 1, the luminescent solar concentrator (LSC) (1) comprises a cell for containing liquids (2) made of transparent walls (e.g., quartz), two holes on the upper side (not represented in FIG. 1) closed with two stoppers (3), an aqueous microemulsion including at least one photoluminescent compound [e.g., 4,7-di-2-thienyl-2,1,3-benzothiadiazole (DTB), or a mixture of 4,7-di-2-thienyl-2,1,3-benzothiadiazole (DTB) and 9,10-diphenylanthracene (DPA)](4), contained inside said cell (2).

With reference to the side view (1b) represented in FIG. 1, the solar device (5) comprises a solar concentrator comprising a cell (2) made of transparent walls (e.g., quartz), two holes on the upper side (not represented in FIG. 1) closed with two stoppers (3) [only one stopper is visible in the side view (1b)], an aqueous microemulsion including at least one photoluminescent compound [e.g., 4,7-di-2-thienyl-2,1,3-benzothiadiazole (DTB), or a mixture of 4,7-di-2-thienyl-2,1,3-benzothiadiazole (DTB) and 9,10-diphenylanthracene (DPA)] (4), contained inside said cell (2), a photovoltaic cell (or solar cell) (6) [e.g., a silicon photovoltaic cell (or solar cell)] positioned on one of the sides of said cell (2), an ammeter (7) connected to said photovoltaic cell (or solar cell) (6).

Some illustrative and non-limiting examples are provided hereinunder for a better understanding of the present invention and for its practical embodiment.

In the following examples, the analytical techniques and characterization methods listed below, were used.

Refraction Index (nD)

The refraction index of the aqueous microemulsions including at least one photoluminescent compound obtained, was measured using an ATAGO RX7000CX refractometer, operating at 20° C. and a wavelength (A) equal to 589.3 nm [wavelength (A) of the inciding light of a sodium lamp (Na)].

Micellar Radius (rm)

The micellar radius of the aqueous microemulsions including at least one photoluminescent compound obtained, was measured using a Zeta sizer granulometer (PCS—Measurement angle 173°) on microemulsions filtered on a filter having a diameter equal to 0.22 μm.

In the following examples:
- the 4,7-di-2-thienyl-2,1,3-benzothiadiazole (DTB) was synthesized as described in Example 1 of international patent application WO 2012/007834 in the name of the Applicant;
- the 9,10-diphenylanthracene (DPA) is of Sigma-Aldrich.

EXAMPLE 1

Preparation of Microemulsions Including 4,7-di-2-thienyl-2,1,3-benzothiadiazole (DTB)

Microemulsions EM2-EM3-EM4-EM5-EM6-EM9-EM12-EM15

13 ml of an 0.6 M solution of sodium dodecyl sulfate (SDS) (Acros Organics 98%) in pure water MilliQ (MQ—Millipore) were poured into a 100 ml flask. 5.7 ml of 1-butanol (Acros Organics 99%) and a suitable volume (Vol.$_{sol.}$) of a solution of 4,7-di-2-thienyl-2,1,3-benzothiadiazole (DTB) in toluene (Carlo Erba) were subsequently added, in sequence, at a suitable concentration so as to obtain a concentration of 4,7-di-2-thienyl-2,1,3-benzothiadiazole in the microemulsion ([DTB]$_{microemuls.}$) equal to $2 \times 10^{-3}$ M (EM2, EM3, EM4, EM5, EM6, EM12 and EM15), or equal to $3.3 \times 10^{-4}$ M (EM9): the quantities of solution (Vol.$_{sol.}$), the concentration of 4,7-di-2-thienyl-2,1,3-benzothiadiazole (DTB$_{conc.}$) and the concentration of 4,7-di-2-thienyl-2,1,3-benzo-thiadiazole in the microemulsion ([DTB]$_{microemuls.}$), are indicated in Table 1.

The microemulsions obtained were subjected to measurements of the refraction index (nD) and of the micellar radius (rm) [the micellar radius (rm) was not measured in the case of the microemulsions EM2, EM3 and EM4] operating as described above: the data obtained are reported in Table 1.

Microemulsions EM7-EM8

10 ml of an 0.95 M solution of sodium dodecyl sulfate (SDS) (Acros Organics 98%) in pure water MilliQ (MQ—Millipore) were poured into a 100 ml flask. 6.7 ml of 1-butanol (Acros Organics 99%) and a suitable volume (Vol.$_{sol.}$) of a solution of 4,7-di-2-thienyl-2,1,3-benzothiadiazole in toluene (Carlo Erba) were subsequently added, in sequence, at a suitable concentration so as to obtain a concentration of 4,7-di-2-thienyl-2,1,3-benzothiadiazole in the microemulsion ([DTB]$_{microemuls.}$) equal to $2 \times 10^{-3}$ M: the quantities of solution (Vol.$_{sol.}$), the concentration of 4,7-di-2-thienyl-2,1,3-benzothiadiazole (DTB$_{conc.}$) and the concentration of 4,7-di-2-thienyl-2,1,3-benzothiadiazole in the microemulsion ([DTB]$_{microemuls.}$), are reported in Table 1.

The microemulsions obtained were subjected to measurements of the refraction index (nD) and of the micellar radius (rm) operating as described above: the data reported are indicated in Table 1.

EXAMPLE 2

Preparation of Microemulsions Including 4,7-di-2-thienyl-2,1,3-benzothiadiazole (DTB) and 9,10-diphenylanthracene (DPA)

Microemulsions EM10-EM14

13 ml of an 0.6 M solution of sodium dodecyl sulfate (SDS) (Acros Organics 98%) in pure water MilliQ (MQ—Millipore) were poured into a 100 ml flask. 5.7 ml of 1-butanol (Acros Organics 99%) and a suitable volume (Vol.$_{sol.}$) of a solution of 4,7-di-2-thienyl-2,1,3-benzothiadiazole and 9,10-diphenylanthracene (DPA) in toluene (Carlo Erba) were subsequently added, in sequence, at a suitable concentration (DTB$_{conc.}$ and DPA$_{conc.}$) so as to obtain a concentration of 4,7-di-2-thienyl-2,1,3-benzothiadiazole (DTB) in the microemulsion ([DTB]$_{microemuls.}$) equal to $1.8 \times 10^{-3}$M and a concentration of 9,10-diphenylanthracene (DPA) in the microemulsion ([DPA]$_{microemuls.}$) equal to $1.8 \times 10^{-3}$M: the quantities of solution (Vol.$_{sol.}$), the concentration of 4,7-di-2-thienyl-2,1,3-benzothiadiazole (DTB$_{conc.}$) and 9,10-diphenylanthracene (DPA$_{conc.}$), and the concentration of 4,7-di-2-thienyl-2,1,3-benzo-thiadiazole ([DTB]$_{microemuls.}$) and 9,10-diphenylanthracene ([DPA]$_{microemuls.}$) in the microemulsion, are reported in Table 2.

The microemulsions obtained were subjected to measurements of the refraction index (nD) and of the micellar radius (rm) operating as described above: the data obtained are reported in Table 2.

EXAMPLE 3

Power Measurements (P$_{max}$)

The power measurements of the microemulsions obtained as described above in Example 1 and in Example 2, were carried out using a Hellma quartz cuvette having dimensions of 10 cm×10 cm×0.6 cm (optical path: 1 mm) filled with 8.1 ml of the microemulsion to be analyzed. A photovoltaic cell IXYS-XOD17 having a surface of 1.2 cm$^2$ connected to an ammeter was applied on an edge of the cuvette.

The surface of the cuvette was then illuminated, with a light source using an ABET solar simulator mod. SUN 2000 equipped with a 550 Watt OF Xenon lamp having a power equal to 1 sun (1000 W/m$^2$), for 10 seconds. A first measurement was carried out, illuminating the whole cuvette (10 cm×10 cm) and the electric power generated due to the illumination, was measured.

Power measurements were then carried out, by covering surfaces of the cuvette having a variable area, with an opaque coating (masking), at an increasing distance from the edge on which the photovoltaic cell was fixed (total of 11 measurements). These measurements, carried out under variable shielding conditions, allow the contribution of possible waveguide, edge or multiple diffusion effects due to the support, to be quantified and then subtracted.

Figure 2:
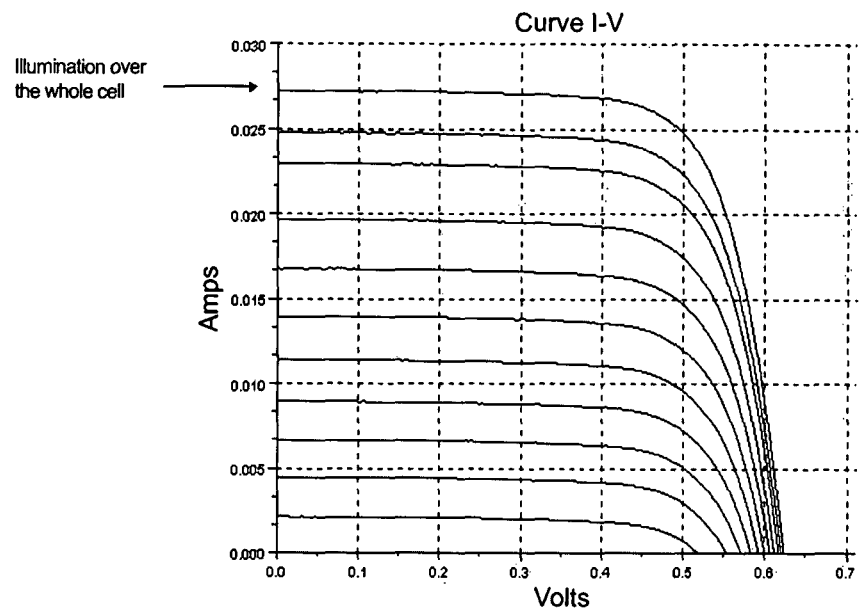
FIG. 2 shows light intensity curves from a luminescent solar concentrator and attached photovoltaic cell, as described in Example 3.
Figure 3:
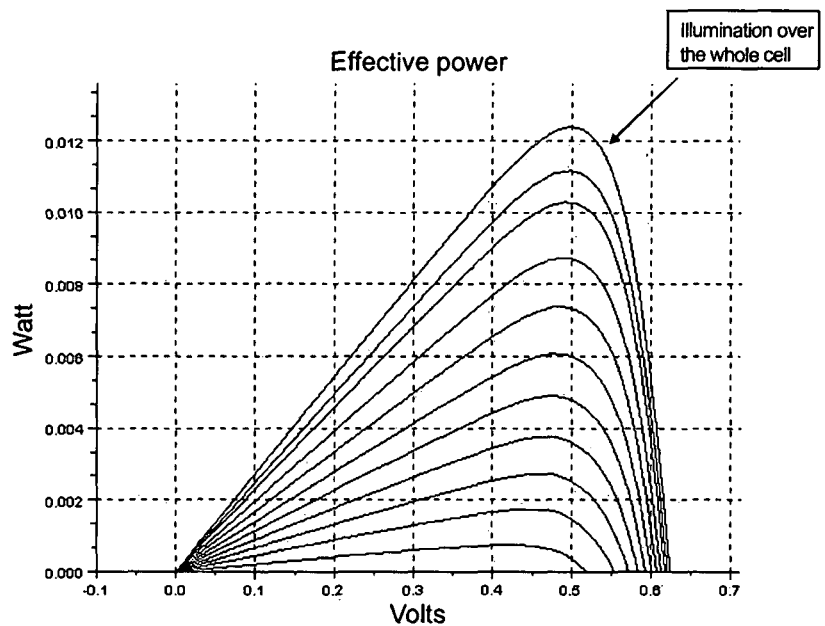
FIG. 3 shows effective power curves obtained from data from FIG. 2, as described in Example 3.

The light intensity curve (measured in ampere)–current produced (measured in volts) (curves I-V indicated in FIG. 2) was registered for each portion of cuvette illuminated, and the effective power of the photovoltaic cell was calculated from this (curves indicated in FIG. 3): the effective power (P$_{max}$) was subsequently normalized per cm$^2$ of surface illuminated and the values obtained are reported in Table 1 and Table 2.

TABLE 1

| Microemulsion | (Vol.$_{sol.}$) (ml) | (DTB$_{conc.}$) (M) | (DTB$_{microemuls.}$) (M) | nD | P$_{max}$ (mW/cm$^2$) | rm (nm) |
|---|---|---|---|---|---|---|
| EM2 | 3.7 | 0.010 | $2 \times 10^{-3}$ | 1.385 | 0.065 | — |
| EM3 | 1.0 | 0.040 | $2 \times 10^{-3}$ | 1.374 | 0.056 | — |
| EM4 | 3.7 | 0.010 | $2 \times 10^{-3}$ | 1.388<br>1.386$^{(a)}$ | 0.067 | — |
| EM5 | 3.7 | 0.010 | $2 \times 10^{-3}$ | 1.388<br>1.3865$^{(b)}$ | 0.068 | 3.62 ± 0.02 |
| EM6 | 1.0 | 0.040 | $2 \times 10^{-3}$ | 1.374 | 0.044 | 2.10 ± 0.01 |
| EM7 | 1.3 | 0.028 | $2 \times 10^{-3}$ | 1.386 | 0.061 | 4.65 ± 0.07 |
| EM8 | 7.7 | 0.0063 | $2 \times 10^{-3}$ | 1.414 | 0.075 | 2.45 ± 0.02 |
| EM9 | 3.7 | 0.002 | $3.3 \times 10^{-4}$ | 1.3875 | 0.043 | 3.50 ± 0.03 |
| EM12 | 1.9 | 0.02 | $2 \times 10^{-3}$ | 1.378 | 0.057 | 2.60 ± 0.1 |
| EM15 | 4.2 | 0.01 | $2 \times 10^{-3}$ | 1.390 | 0.064 | 5.6 ± 0.3 |

$^{(a)}$refraction index (nD) measured after 5 months;
$^{(b)}$refraction index (nD) measured after 2 months.

TABLE 2

| Micro-emulsion | (Vol.$_{sol.}$) (ml) | (DTB$_{conc.}$) (M) | (DTB$_{microemuls.}$) (M) | (DPA$_{conc.}$) (M) | (DPA$_{microemuls.}$) (M) | nD | P$_{max}$ (mW/cm$^2$) | rm (nm) |
|---|---|---|---|---|---|---|---|---|
| EM10 | 4.2 | 0.010 | $1.8 \times 10^{-3}$ | 0.010 | $1.8 \times 10^{-3}$ | 1.389 | 0.070 | 3.58 ± 0.01 |
| EM14 | 4.2 | 0.010 | $1.8 \times 10^{-3}$ | 0.010 | $1.8 \times 10^{-3}$ | 1.390 | 0.071 | 4.42 ± 0.08 |

The invention claimed is:

1. An aqueous microemulsion for a luminescent solar concentrator (LSC) comprising:
from 20% by weight to 90% by weight of water with respect to the total weight of surfactant+co-surfactant+water;
from 3% by weight to 25% by weight of at least one surfactant with respect to the total weight of surfactant+co-surfactant+water;
from 6% by weight to 50% by weight of at least one co-surfactant with respect to the total weight of surfactant+co-surfactant+water;
from 1% by weight to 90% by weight of at least one organic solvent immiscible with water with respect to the total weight of organic solvent immiscible with water+water;
from 0.02% by weight to 2% by weight of at least one photoluminescent compound with respect to the total weight of photoluminescent compound+organic solvent immiscible with water.

2. The aqueous microemulsion according to claim 1, wherein said aqueous microemulsion comprises from 50% by weight to 70% by weight of water with respect to the total weight of surfactant+co-surfactant+water.

3. The aqueous microemulsion according to claim 1, wherein said aqueous microemulsion comprises from 10% by weight to 15% by weight of at least one surfactant with respect to the total weight of surfactant+co-surfactant+water.

4. The aqueous microemulsion according to claim 1, wherein said aqueous microemulsion comprises from 20% by weight to 30% by weight of at least one co-surfactant with respect to the total weight of surfactant+co-surfactant+water.

5. The aqueous microemulsion according to claim 1, wherein said aqueous microemulsion comprises from 5% by weight to 20% by weight of at least one organic solvent immiscible with water with respect to the total weight of organic solvent immiscible with water+water.

6. The aqueous microemulsion according to claim 1, wherein said aqueous microemulsion comprises from 0.1% by weight to 0.5% by weight of at least one photoluminescent compound with respect to the total weight of photoluminescent compound+organic solvent immiscible with water.

7. The aqueous microemulsion according to claim 1, wherein said photoluminescent compound is selected from benzothiadiazole compounds, acene compounds, or mixtures thereof, wherein said photoluminescent acene compounds absorb infrared radiation and are soluble and stable in the organic solvent immiscible with water.

8. The aqueous microemulsion according to claim 1, wherein said surfactant is selected from sodium dodecyl sulfate (SDS), sodium octadecyl sulfate, nonylphenol ether sulfate, or mixtures thereof.

9. The aqueous microemulsion according to claim 1, wherein said co-surfactant is selected from 1-butanol, 1-pentanol, 1-hexanol, 1-octanol, or mixtures thereof.

10. The aqueous microemulsion according to claim 1, wherein said organic solvent immiscible with water is selected from toluene, cyclohexane, heptane, or mixtures thereof.

11. A luminescent solar concentrator (LSC) comprising:
a container including transparent walls; and
at least one aqueous microemulsion according to claim 2 disposed in said container.

12. The luminescent solar concentrator (LSC) according to claim 11, wherein said transparent walls comprise at least one of alumina, titania, or mixtures thereof.

13. A solar device comprising at least one photovoltaic cell or at least one photoelectrolytic cell positioned on a luminescent solar concentrator (LSC) according to claim 11.

14. The luminescent solar concentrator (LSC) according to claim 11 wherein said transparent walls comprise silica.

* * * * *